(12) United States Patent
Ramaswamy et al.

(10) Patent No.: US 7,276,416 B2
(45) Date of Patent: Oct. 2, 2007

(54) METHOD OF FORMING A VERTICAL TRANSISTOR

(75) Inventors: Nirmal Ramaswamy, Boise, ID (US); Gurtej S. Sandhu, Boise, ID (US); Cem Basceri, Reston, VA (US); Eric R. Blomiley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 11/256,424

(22) Filed: Oct. 20, 2005

(65) Prior Publication Data

US 2006/0046395 A1    Mar. 2, 2006

Related U.S. Application Data

(62) Division of application No. 10/931,924, filed on Sep. 1, 2004, now Pat. No. 7,144,779.

(51) Int. Cl.
*H01L 21/336* (2006.01)
(52) U.S. Cl. ............... 438/268; 438/269; 257/E21.104; 257/E21.132; 257/E21.41
(58) Field of Classification Search ................ 438/268, 438/269, 479; 257/E21.104, E21.132, E21.41
See application file for complete search history.

(56) References Cited

U.S. PATENT DOCUMENTS

| 4,758,531 | A |   | 7/1988  | Beyer et al.    |
|-----------|---|---|---------|-----------------|
| 5,039,625 | A |   | 8/1991  | Reisman et al.  |
| 5,073,516 | A |   | 12/1991 | Moslehi         |
| 5,248,385 | A |   | 9/1993  | Powell          |
| 5,250,837 | A |   | 10/1993 | Sparks          |
| 5,340,754 | A | * | 8/1994  | Witek et al. ................ 438/156 |
| 5,753,555 | A |   | 5/1998  | Hada            |
| 5,763,305 | A |   | 6/1998  | Chao            |
| 6,060,746 | A |   | 5/2000  | Bertin et al.   |
| 6,064,081 | A |   | 5/2000  | Robinson et al. |
| 6,204,532 | B1|   | 3/2001  | Gambino et al.  |
| 6,279,531 | B1|   | 10/2001 | Armacost et al. |
| 6,406,962 | B1|   | 6/2002  | Agnello et al.  |
| 6,436,770 | B1|   | 8/2002  | Leung et al.    |

(Continued)

OTHER PUBLICATIONS

Bashir et al., *Characterization and modeling of sidewall defects in selective epitaxial growth of silicon*, J. Vac. Sci. Technol. B, vol. 13, Part 3, pp. 928-935 (May/Jun. 1995).

(Continued)

*Primary Examiner*—Trung Dang
(74) *Attorney, Agent, or Firm*—Wells St. John P.S.

(57) ABSTRACT

The invention includes methods of forming epitaxial silicon-comprising material and methods of forming vertical transistors. In one implementation, a method of forming epitaxial silicon-comprising material includes providing a substrate comprising monocrystalline material. A first portion of the monocrystalline material is outwardly exposed while a second portion of the monocrystalline material is masked. A first silicon-comprising layer is epitaxially grown from the exposed monocrystalline material of the first portion and not from the monocrystalline material of the masked second portion. After growing the first silicon-comprising layer, the second portion of the monocrystalline material is unmasked. A second silicon-comprising layer is then epitaxially grown from the first silicon-comprising layer and from the unmasked monocrystalline material of the second portion. Other aspects and implementations are contemplated.

27 Claims, 13 Drawing Sheets

U.S. PATENT DOCUMENTS

| | | |
|---|---|---|
| 6,437,375 B1 | 8/2002 | Beaman |
| 6,448,129 B1 | 9/2002 | Cho et al. |
| 6,506,638 B1 | 1/2003 | Yu |
| 6,518,609 B1 | 2/2003 | Ramesh |
| 6,617,226 B1 | 9/2003 | Suguro et al. |
| 6,624,032 B2 | 9/2003 | Alavi et al. |
| 6,642,539 B2 | 11/2003 | Ramesh et al. |
| 6,703,290 B2 | 3/2004 | Boydston et al. |
| 6,713,378 B2 | 3/2004 | Drynan |
| 6,716,687 B2 | 4/2004 | Wang et al. |
| 6,716,719 B2 | 4/2004 | Clampitt et al. |
| 6,746,923 B2 | 6/2004 | Skotnicki et al. |
| 6,790,713 B1 | 9/2004 | Horch |
| 6,805,962 B2 | 10/2004 | Bedell et al. |
| 6,855,436 B2 | 2/2005 | Bedell et al. |
| 6,858,499 B2 * | 2/2005 | Bol ............... 438/268 |
| 6,878,592 B1 | 4/2005 | Besser et al. |
| 6,885,069 B2 | 4/2005 | Ohguro |
| 6,946,377 B2 | 9/2005 | Chambers |
| 2001/0010962 A1 | 8/2001 | Chen et al. |
| 2001/0017392 A1 * | 8/2001 | Comfort et al. ............ 257/410 |
| 2001/0025985 A1 | 10/2001 | Noble |
| 2002/0081861 A1 | 6/2002 | Robinson et al. |
| 2003/0027406 A1 | 2/2003 | Malone |
| 2003/0153155 A1 | 8/2003 | Wang et al. |
| 2003/0211712 A1 | 11/2003 | Chen et al. |
| 2004/0121546 A1 * | 6/2004 | Yoo ............... 438/268 |
| 2004/0241460 A1 | 12/2004 | Bedell et al. |
| 2005/0224800 A1 | 10/2005 | Lindert et al. |
| 2006/0046391 A1 * | 3/2006 | Tang et al. ............... 438/268 |
| 2006/0051941 A1 | 3/2006 | Biomiley et al. |
| 2006/0081884 A1 | 4/2006 | Abbott et al. |
| 2006/0125044 A1 * | 6/2006 | Haller ............... 257/506 |
| 2006/0264010 A1 | 11/2006 | Ramaswamy et al. |

OTHER PUBLICATIONS

U.S. Appl. No. 10/932,129, filed Sep. 2004, Ramaswami et al.
U.S. Appl. No. 10/932,151, filed Sep. 2004, Ramaswami et al.
U.S. Appl. No. 11/035,298, filed Jan. 2005, Blomiley et al.

* cited by examiner

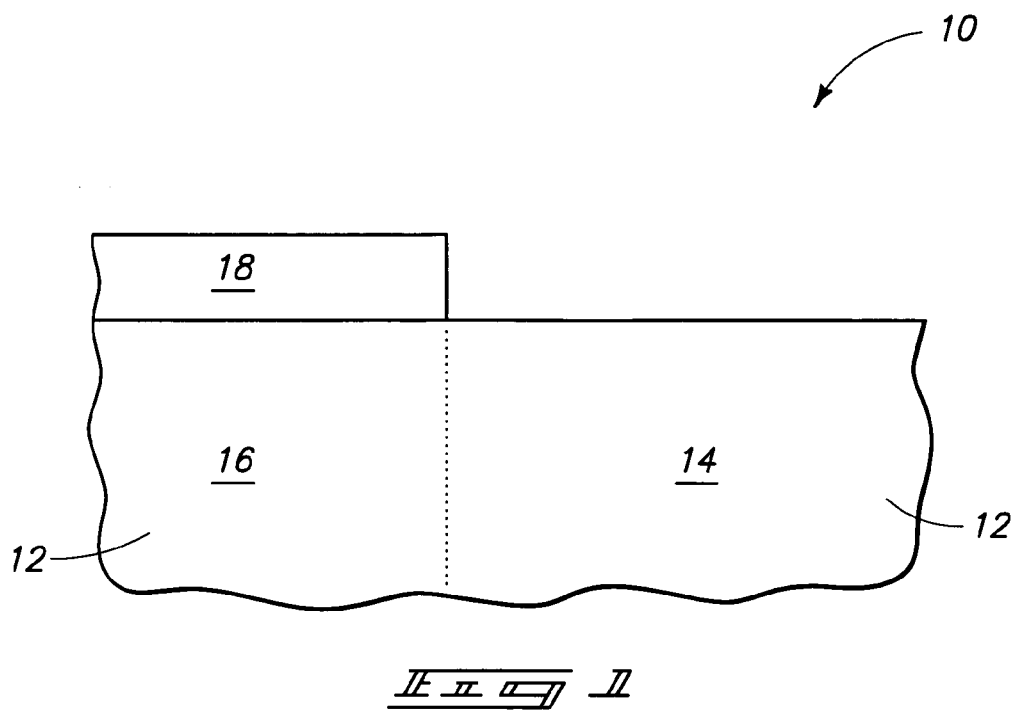
$\mathbb{F}\mathbb{i} \mathbb{g}\, 1$
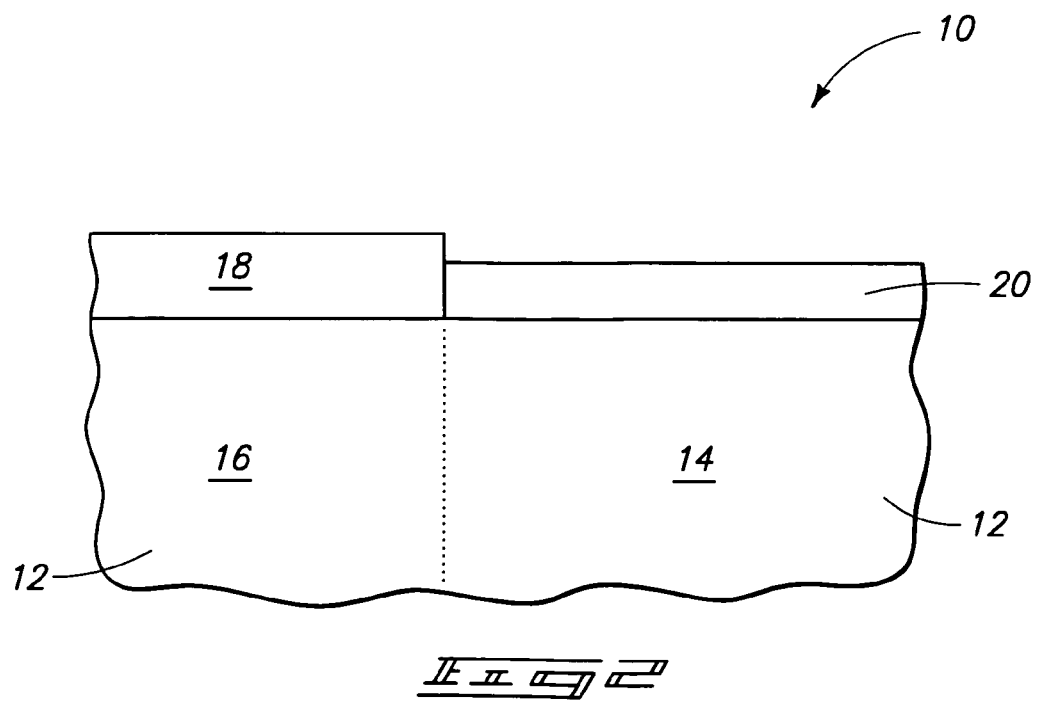
$\mathbb{F}\mathbb{i}\mathbb{g}\, 2$

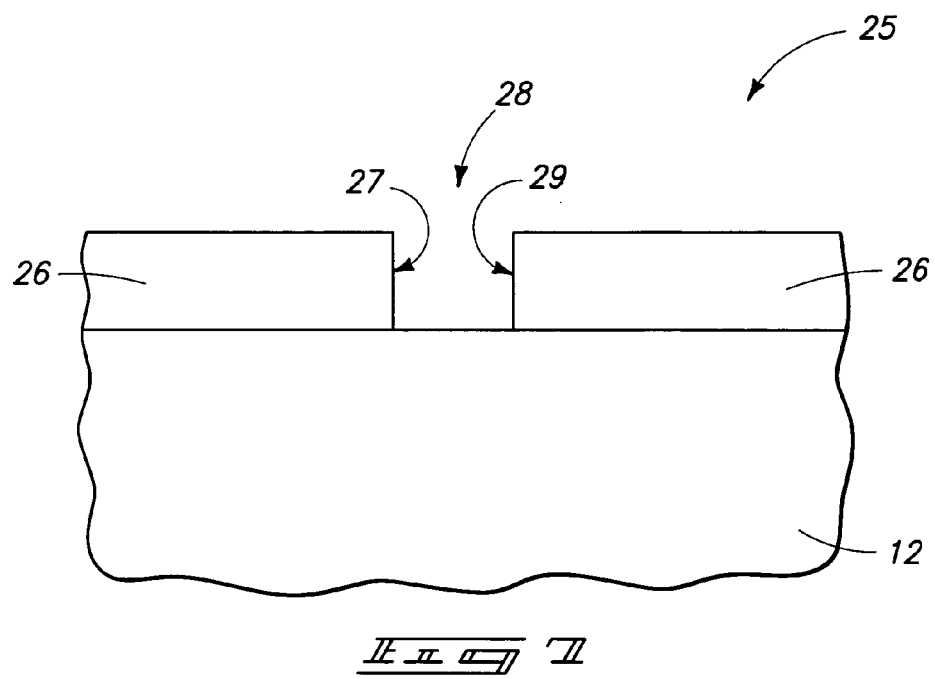
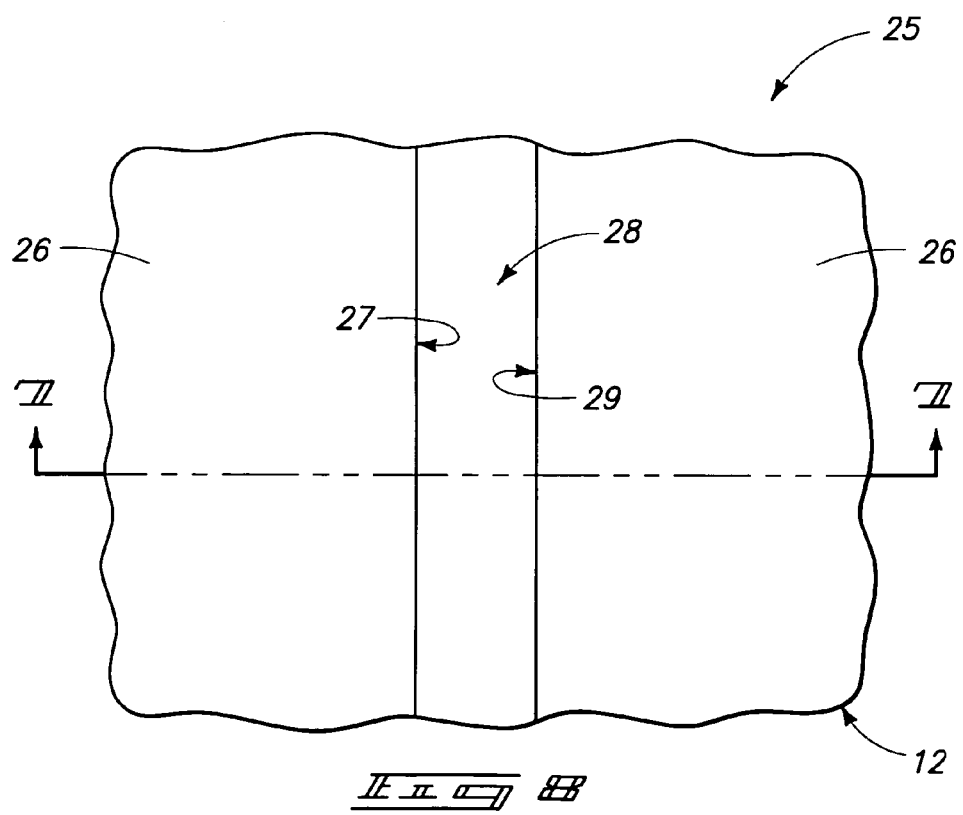

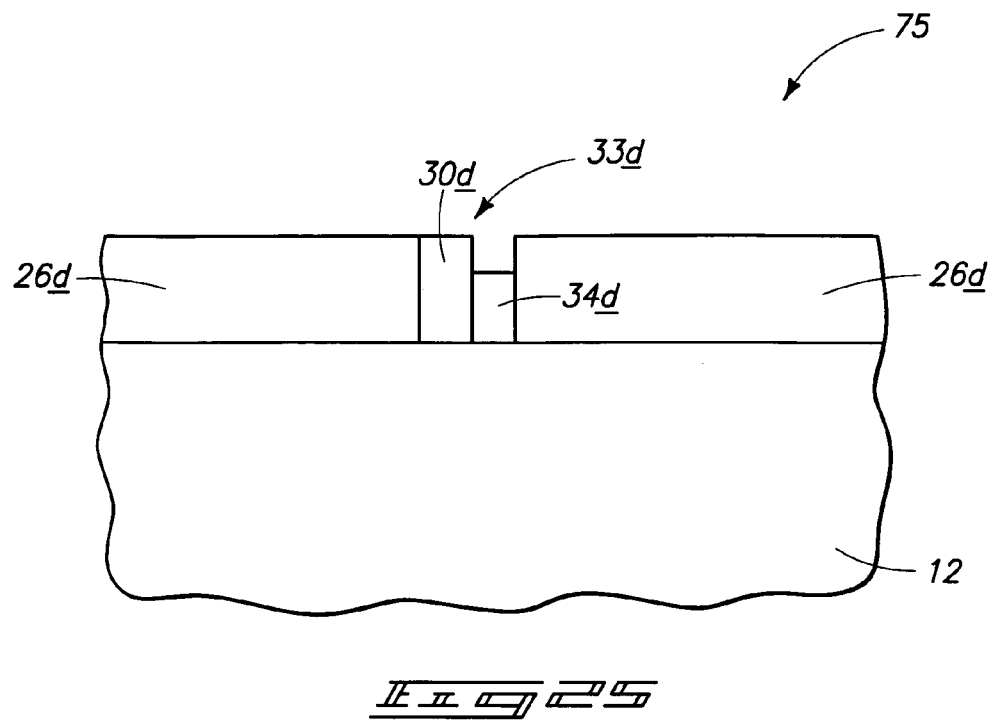
_Fig 25_
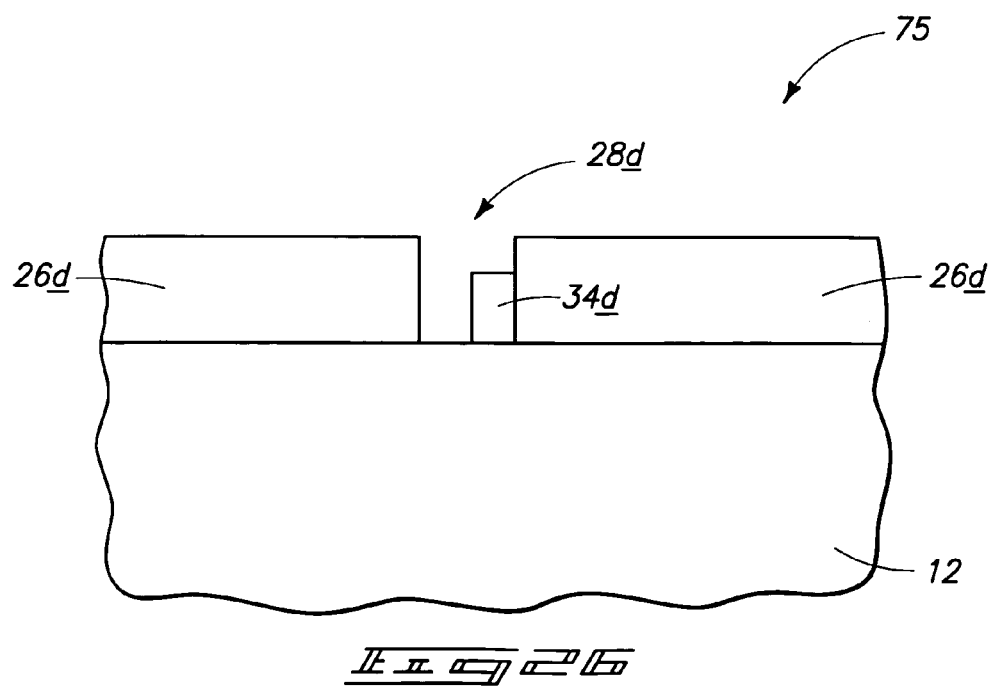
_Fig 26_

METHOD OF FORMING A VERTICAL TRANSISTOR

RELATED PATENT DATA

This patent resulted from a divisional application of U.S. patent application Ser. No. 10/931,924, filed on Sep. 1, 2004, entitled "Method of Forming Epitaxial Silicon-Comprising Material", naming D. V. Nirmal Ramaswamy, Gurtej S. Sandhu, Cem Basceri and Eric R. Blomiley as inventors, the disclosure of which is incorporated by reference.

TECHNICAL FIELD

This invention relates to a method of forming epitaxial silicon-comprising material and a method of forming a vertical transistor.

BACKGROUND OF THE INVENTION

Silicon is a common semiconductive material used in the fabrication of integrated circuits. Silicon can occur in crystalline and amorphous forms, and when crystalline can be monocrystalline or polycrystalline. In some instances, silicon is combined with germanium, essentially forming a silicon germanium alloy. Such materials can be doped with conductivity enhancing impurities (i.e., boron and/or phosphorus) to modify the conducting characteristics of the silicon-comprising material.

Monocrystalline silicon can be provided in bulk substrate form or otherwise grown or deposited epitaxially from an exposed monocrystalline material. Epitaxy generally involves the growth or deposition of a single or monocrystalline layer of material such that the epitaxial layer has a crystal orientation which is common to that of the material from which it is grown. One factor that determines the quality of the epitaxial silicon-comprising layer relates to the presence and quantity of crystallographic defects. Such are non-uniformities in the crystal structure of the epitaxial layer. Many of these defects are caused by defects appearing at the surface of the substrate which propagate into the layer during growth. Examples include sidewall dislocations and stacking faults. Dislocations and stacking faults can be electrically active more so than the surrounding material within the epitaxial layer due to the presence of dangling bonds. Such can lead to unnecessary recombination generation currents, lower breakdown voltages, higher current leakage and larger junction ideality factors.

One place where epitaxial silicon has been utilized is as one or more of the components in a field effect transistor. Transistor structures comprise a channel region received between a pair of source/drain regions, and a gate configured to electrically connect the source/drain regions to one another through the channel region. The transistor constructions utilized in semiconductor constructions are supported by a semiconductor substrate. The semiconductor substrate will have a primary surface which can be considered to define a horizontal direction. Transistor devices can be divided into two broad categories based upon the orientations of the channel regions relative to the primary surface of the semiconductor substrate. Specifically, transistor structures which have channel regions that are primarily parallel to the primary surface of the substrate are referred to as planar or horizontal transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar or horizontal transistor devices are devices in which the current flow between source and drain regions is primarily parallel to the primary surface of the semiconductor substrate.

Epitaxial silicon-comprising materials have been proposed for use in channel regions of vertical transistors. Further, one or both of the source/drain areas of a vertical transistor might also comprise epitaxially grown silicon or an epitaxially grown silicon germanium alloy. Requirements for epitaxial materials within a vertically oriented channel region are typically more stringent than for the use of such material in source/drain regions of horizontally oriented field effect transistors. Further, fabrication of vertical field effect transistors typically utilizes masks of oxide, nitride or other materials for self-aligned patterning of the epitaxial silicon-comprising material during its formation. The interface of the epi with these materials can be a defect source. Further, the selective epitaxial growth of silicon for vertical transistors typically utilizes lower deposition temperatures as compared to blanket epitaxial silicon depositions. Unfortunately, the use of lower temperatures reduces surface mobility and can also result in increased defects over that of higher temperature processing. Also and regardless, thermal stress can be generated during cool-down of the substrate from the temperature at which the epitaxial silicon-comprising material was grown. This can result in crystallographic defects being generated after growth.

Further, where the epitaxial silicon-comprising material includes germanium, such has an increased tendency for defect formation on the surface during deposition due to mismatched lattice constants of silicon and germanium. These defects propagate and either terminate with other defects or at the surface. Regardless, after deposition, crystallographic defects are extremely difficult to remove or heal within the bulk epitaxially grown material or at interfaces of such material with other materials.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming epitaxial silicon-comprising material and methods of forming vertical transistors. In one implementation, a method of forming epitaxial silicon-comprising material includes providing a substrate comprising monocrystalline material. A first portion of the monocrystalline material is outwardly exposed while a second portion of the monocrystalline material is masked. A first silicon-comprising layer is epitaxially grown from the exposed monocrystalline material of the first portion and not from the monocrystalline material of the masked second portion. After growing the first silicon-comprising layer, the second portion of the monocrystalline material is unmasked. A second silicon-comprising layer is then epitaxially grown from the first silicon-comprising layer and from the unmasked monocrystalline material of the second portion.

In one implementation, a method of forming a vertical transistor includes providing material over a monocrystalline surface and including an opening in the material extending to the monocrystalline surface. A first silicon-comprising layer is epitaxially grown from the monocrystalline surface within the opening. After growing the first silicon-comprising layer, the opening is widened effective to expose an additional monocrystalline surface. A second silicon-comprising layer is epitaxially grown from the additional monocrystalline surface within the widened opening and from the first silicon-comprising layer. A gate dielectric layer of the vertical transistor is formed over the second silicon-comprising layer, and a gate of the vertical transistor is formed over the gate dielectric layer. The second silicon-comprising layer is provided to comprise at least a part of both a channel region of the vertical transistor and a source/drain region of the vertical transistor.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor substrate in process in accordance with an aspect of the invention.

FIG. 2 is a view of the FIG. 1 substrate at a processing step subsequent to that shown by FIG. 1.

FIG. 7 is a diagrammatic sectional view of a semiconductor substrate in process in accordance with an aspect of the invention.

FIG. 8 is a diagrammatic top plan view of the FIG. 7 substrate, with FIG. 7 being a cut taken through line 7—7 in FIG. 8.

FIG. 25 is a diagrammatic sectional view of a semiconductor substrate in process in accordance with an aspect of the invention.

FIG. 26 is a view of the FIG. 25 substrate at a processing step subsequent to that shown by FIG. 25.

DETAILED DESCRIPTION OF THE PREFERRED EMBODIMENTS

Figure 3:
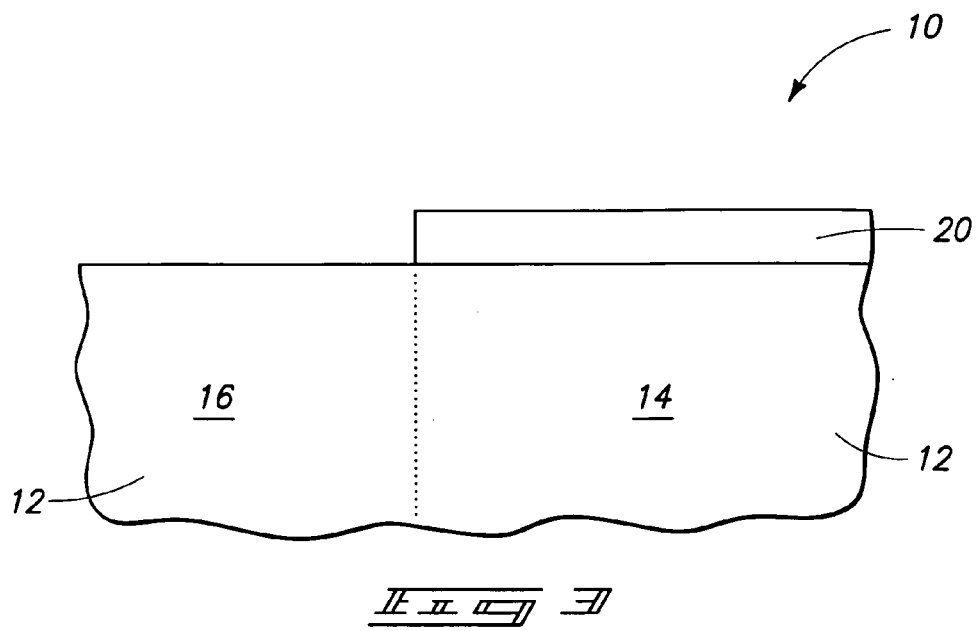
FIG. 3 is a view of the FIG. 2 substrate at a processing step subsequent to that shown by FIG. 2.

This disclosure of the invention is submitted in furtherance of the constitutional purposes of the U.S. Patent Laws "to promote the progress of science and useful arts" (Article 1, Section 8).

Exemplary first embodiment methods of forming layers comprising epitaxial silicon are initially described with reference to FIGS. 1–6. Referring to FIG. 1, a substrate, preferably a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a monocrystalline material 12, for example and by way of example only, lightly doped monocrystalline silicon or a monocrystalline silicon germanium alloy. Such might be provided by any existing or yet-to-be developed method, for example as a bulk monocrystalline substrate, a semiconductor-on-insulator substrate, epitaxially grown, etc. Monocrystalline material 12 can be considered as comprising a first portion 14 and a second portion 16, with such being shown adjacent one another in the depicted preferred embodiment although such might be separated relative one another. FIG. 1 depicts first portion 14 of monocrystalline material 12 being outwardly exposed while second portion 16 of monocrystalline material 12 is masked. In the depicted exemplary embodiment, second portion 16 is masked with a masking material 18. Such might comprise any suitable insulative, conductive, semiconductive (doped or undoped), sacrificial, or non-sacrificial material from which epitaxially grown silicon-comprising material does not grow or deposit upon for at least some initial thickness while such will grow or deposit upon from portion 14. By way of example only, exemplary materials are silicon dioxides, silicon nitrides, silicon oxynitrides, hafnium oxides and aluminum oxides.

Referring to FIG. 2, a first silicon-comprising layer 20 has been epitaxially grown from exposed monocrystalline material 12 of first portion 14 and not from monocrystalline material 12 of masked second portion 16. In accordance with aspects of the invention, the epitaxial growth of first silicon-comprising layer 20 might occur by any existing or yet-to-be developed methods. An exemplary preferred technique includes a temperature range of from 300° C. to 1,000° C., and a pressure range of from 10 mTorr to 100 Torr. Exemplary preferred gases for the deposition of epitaxial silicon include dichlorosilane at 0.2 liter/minute, $H_2$ at 20 liters/minute and HCl at 0.15 liter/minute in a single wafer processor having a chamber volume of eight to twelve liters. By way of example only, if the first silicon-comprising layer is to comprise another material, for example germanium, $GeH_4$ is an exemplary preferred gas flowed proportionally relative to the volume flow of dichlorosilane to achieve the desired concentration of germanium. Other silicon-comprising epitaxially grown layers are also contemplated, and such might or might not include conductivity enhancing doping (i.e., phosphorus, boron and/or arsenic) during the growth phase, subsequently thereto or not at all.

Referring to FIG. 3, and after epitaxially growing first silicon-comprising layer 20, second portion 16 of monocrystalline material 12 has been unmasked. One preferred technique of unmasking comprises etching, for example of masking material 18, and preferably selectively relative to materials 20 and 12, as shown. In the context of this document, a selective etching or removal of one material relative to another requires a removal rate of at least 2:1 of the one material to the other.

Figure 4:
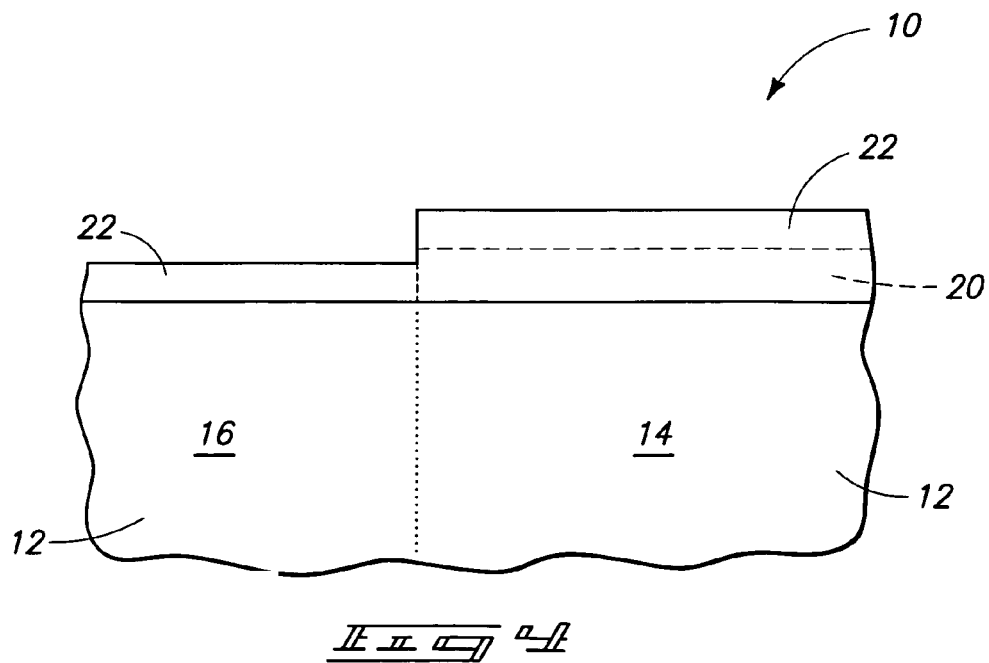
FIG. 4 is a view of the FIG. 3 substrate at a processing step subsequent to that shown by FIG. 3.

Referring to FIG. 4, and after the unmasking, a second silicon-comprising layer 22 has been epitaxially grown from first silicon-comprising layer 20 and from unmasked monocrystalline material 12 of second portion 16. The conditions of the epitaxial growing of the second silicon-comprising layer might be the same or different from the conditions of the epitaxial growing of the first silicon-comprising layer, and regardless the first and second silicon-comprising layers might be of the same composition or of different compositions. FIG. 4 diagrammatically depicts the compositions as being the same by indication of the dashed lines from where the second silicon-comprising layer 22 has been grown from the first silicon-comprising layer 20, with such interface possibly being largely indistinguishable when the same composition materials are grown. Further in the depicted preferred embodiment, and particularly where first portion 14 and second portion 16 are adjacent one another, the second silicon-comprising layer contiguously extends from over first portion 14 to over second portion 16.

Figure 5:
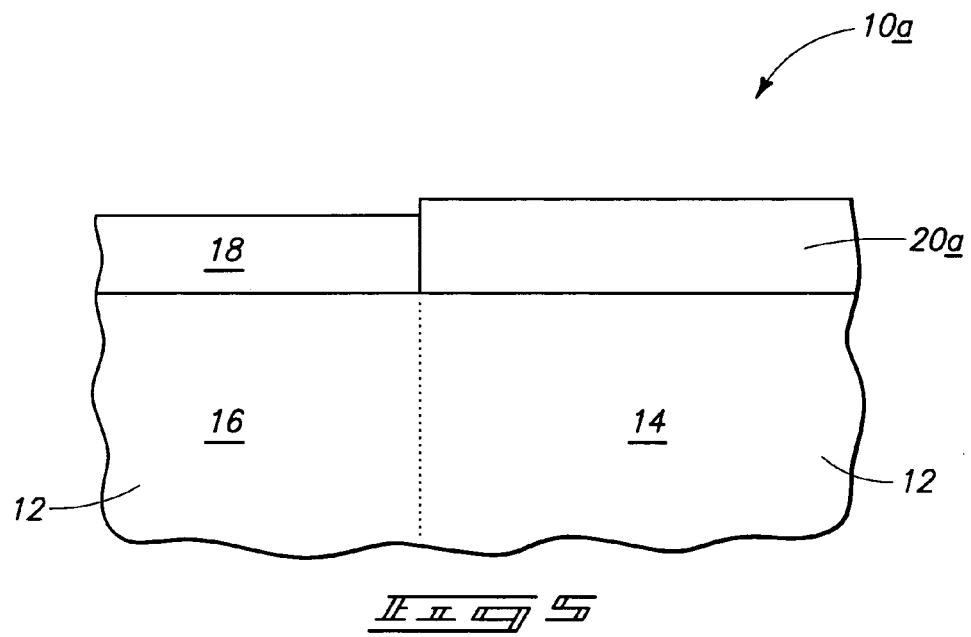
FIG. 5 is a diagrammatic sectional view of a semiconductor substrate in process in accordance with an aspect of the invention.
Figure 6:
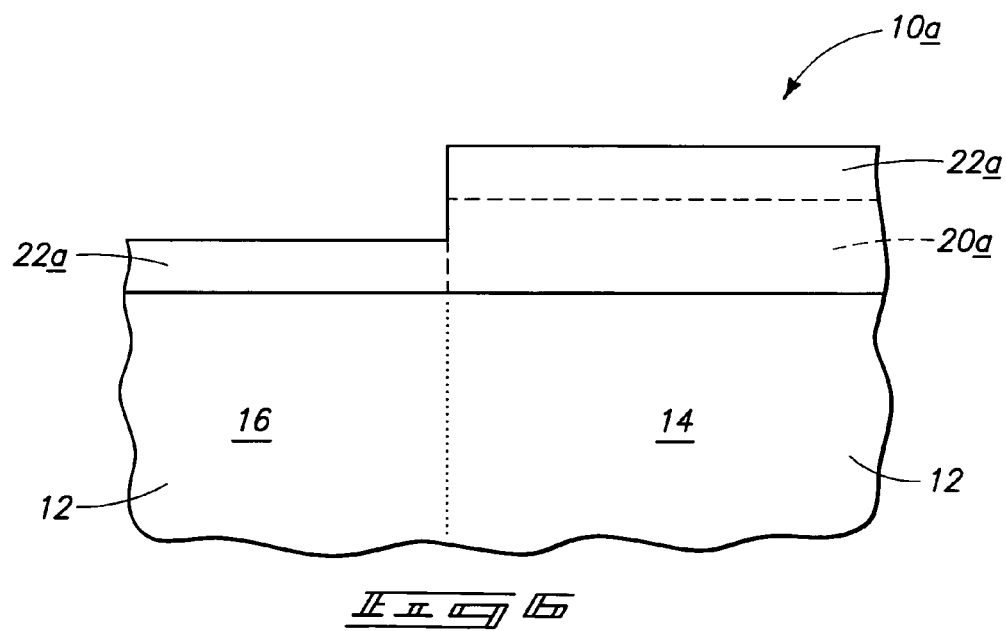
FIG. 6 is a view of the FIG. 5 substrate at a processing step subsequent to that shown by FIG. 5.

FIGS. 1–4 depict an exemplary embodiment wherein the epitaxial growing of first silicon-comprising layer 20 is to an elevational thickness which is less than that of masking material 18 (FIG. 2). However, the invention of course also contemplates epitaxial growing of the first silicon-comprising layer to an elevational thickness which is equal to that of the masking material or to greater than that of the masking material. By way of example only, FIGS. 5 and 6 depict an alternate exemplary substrate fragment 10a. Like numerals from the first-described embodiment have been utilized where appropriate, with differences being indicated by the suffix "a". FIG. 5 depicts epitaxial growing of first silicon-comprising layer 20a to an elevational thickness which is greater than that of masking material 18.

Referring to FIG. 6, second portion 16 of monocrystalline material 12 has been unmasked and a second silicon-comprising layer 22a is epitaxially grown from first silicon-comprising layer 20a and from unmasked monocrystalline material 12 of second portion 16.

Additional exemplary implementations of preferred aspects of the invention are next described with reference to FIGS. 7–13. FIG. 7 depicts a substrate fragment 25 comprising monocrystalline material 12, for example as described above in connection with the first-described embodiment. A first material 26 has been formed to be received over monocrystalline material 12. Material 26 might be insulative, conductive (including conductively doped semiconductive material) and/or semiconductive material independent of conductivity enhancing impurity doping. By way of example only, exemplary materials include silicon nitrides, silicon dioxides, silicon oxynitrides, hafnium oxides and aluminum oxides. An opening 28 has been provided within first material 26. An exemplary method of forming the same comprises photolithographic patterning and etch, although any other existing or yet-to-be developed methods are also contemplated. For example and by way of example only, opening 28 might be provided by laser ablation, masked or maskless formation of material 26 over substrate 12, etc. In the embodiment exemplified by FIG. 7, opening 28 has been formed within first material 26 to extend to monocrystalline material 12. For purposes of the continuing discussion, opening 28 can be considered as having opposing sidewalls 27 and 29. FIGS. 7 and 8 depict one exemplary preferred embodiment wherein opening 28 comprises a line or trench in first material 26.

Figure 9:
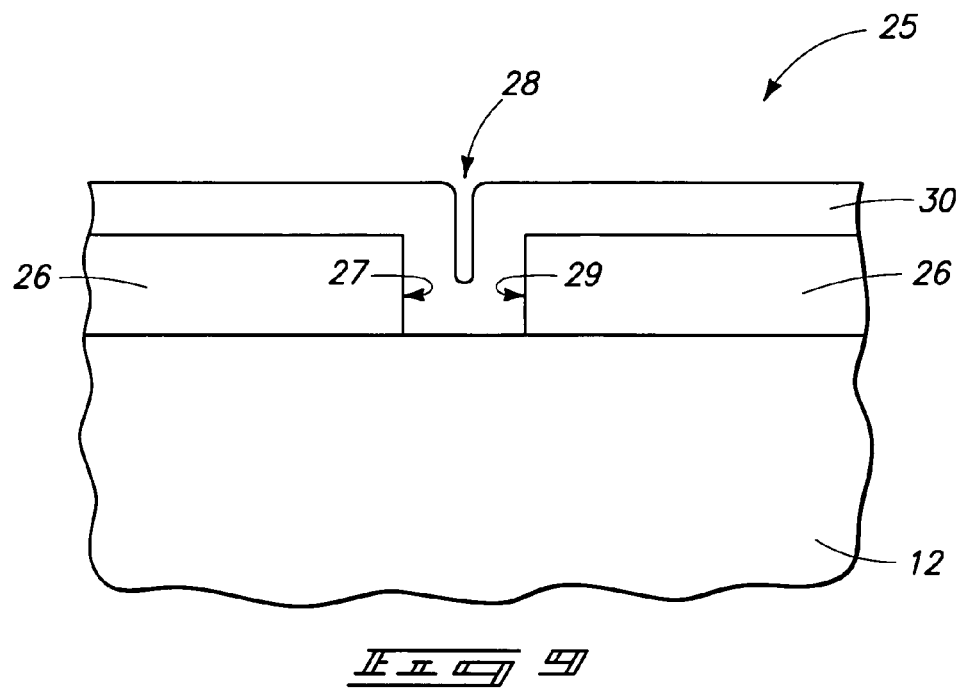
FIG. 9 is a view of the FIG. 7 substrate at a processing step subsequent to that shown by FIG. 7.

Referring to FIG. 9, a second material 30 has been deposited over first material 26 and to within opening 28 laterally over sidewalls 27 and 29. Second material 30 might be insulative, conductive or semiconductive, with all or some of such being removed in the inventive described fabrication methods, and as well may or may not constitute a portion of the finished integrated circuitry construction. Exemplary preferred insulative materials include $SiO_2$, silicon oxynitride ($SiO_xN_y$), and $Si_3N_4$. An exemplary conductive material includes doped carbon.

Figure 10:
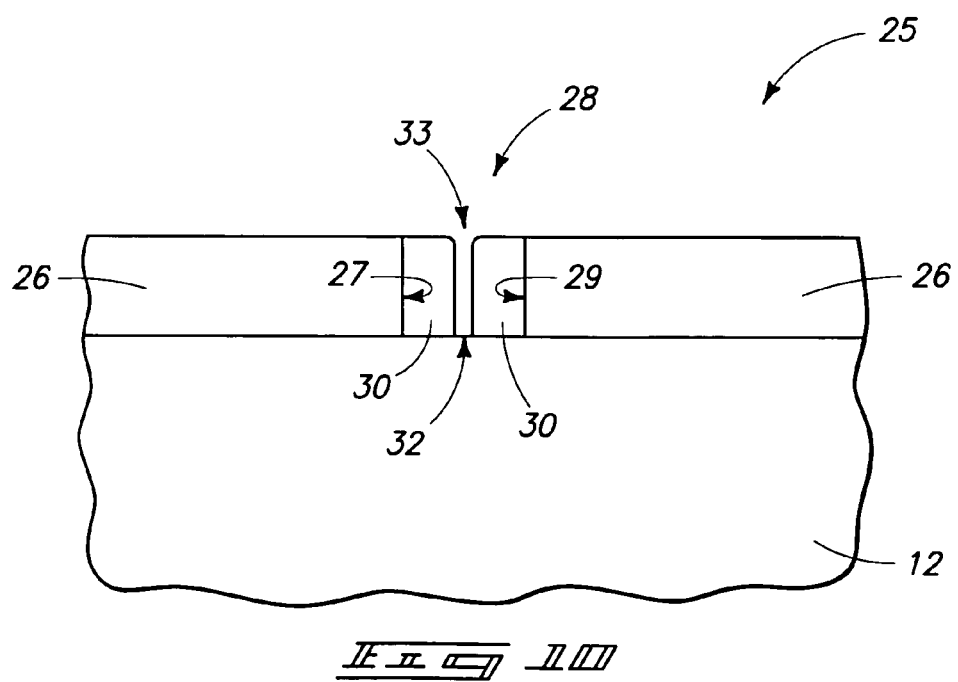
FIG. 10 is a view of the FIG. 9 substrate at a processing step subsequent to that shown by FIG. 9.

Referring to FIG. 10, second material 30 has been anisotropically etched effective to expose monocrystalline material 12 within opening 28, and most preferably selectively relative to first material 26. Such describes but one preferred exemplary method of lining opposing sidewalls 27 and 29 of opening 28 with a second material 30, and exposing monocrystalline material 12 at a base 32 of second material-lined opening 28. In one exemplary preferred implementation, the anisotropic etching of second material 30 is effective to expose monocrystalline material 12 centrally within opening 28. For purposes of the continuing discussion, FIG. 10 can be considered as depicting an opening 33 provided in materials 30 and 26 to a monocrystalline surface 32.

Figure 11:
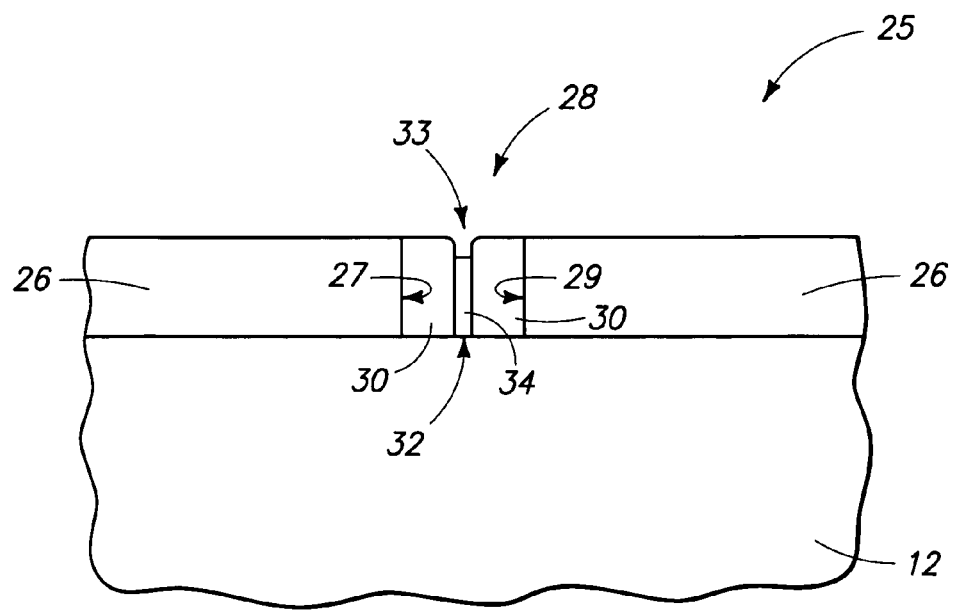
FIG. 11 is a view of the FIG. 10 substrate at a processing step subsequent to that shown by FIG. 10.

Referring to FIG. 11, a first silicon-comprising layer 34 has been epitaxially grown from exposed monocrystalline material 12 within second material-lined opening 28, and for example, from monocrystalline surface 32 within opening 33. Preferred compositions and aspects of growing such material are as described above in connection with the first-described embodiment.

Figure 12:
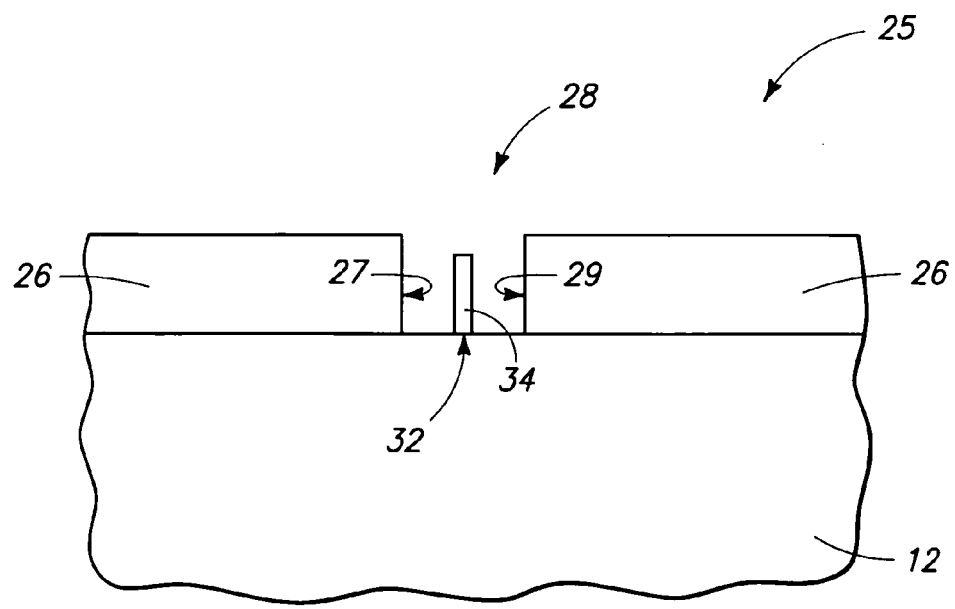
FIG. 12 is a view of the FIG. 11 substrate at a processing step subsequent to that shown by FIG. 11.

Referring to FIG. 12, at least a portion of second material lining 30 has been removed, and monocrystalline material therebeneath is exposed. In the depicted preferred embodiment, such removing is of all remaining of second material lining 30. In one preferred embodiment, the removing comprises etching, with the preferred etching being conducted selectively relative to first material 26. By way of example only where first material 26 comprises silicon nitride and second material 30 comprises undoped silicon dioxide, an exemplary wet etching chemistry includes a combination of HF, ammonium hydroxide and hydrogen peroxide. Further in the depicted preferred embodiment, the etching of the second material lining is effective to expose monocrystalline material therebeneath adjacent the first silicon-comprising layer.

Figure 13:
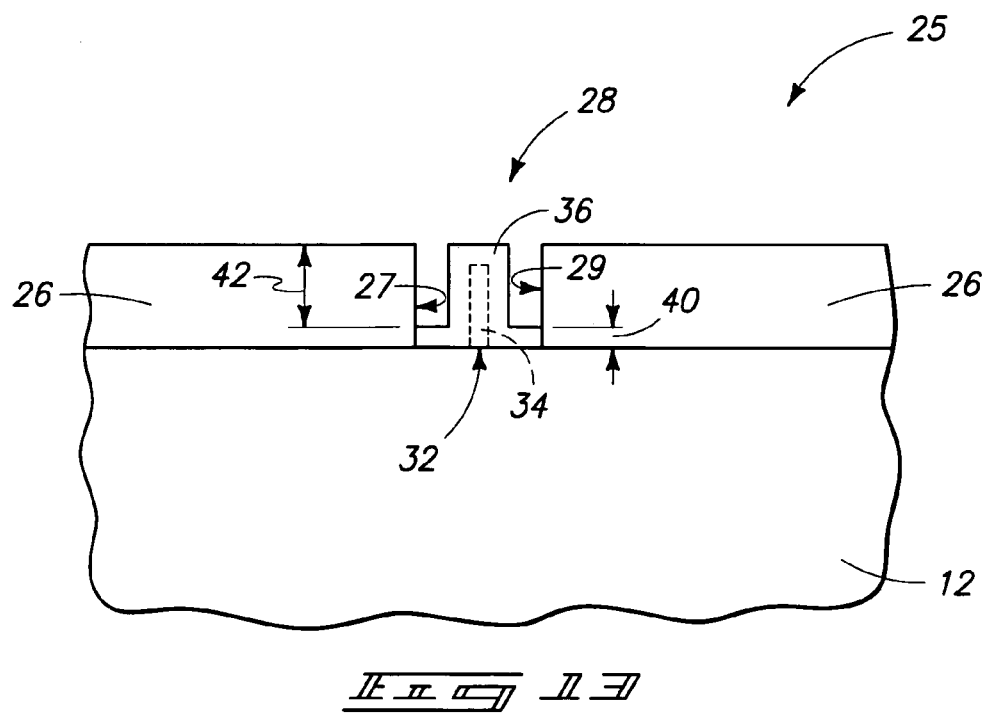
FIG. 13 is a view of the FIG. 12 substrate at a processing step subsequent to that shown by FIG. 12.

Referring to FIG. 13, a second silicon-comprising layer 36 has been epitaxially grown from first silicon-comprising layer 34 and from monocrystalline material 12 exposed within opening 28 beneath the second material 30 that was removed. Exemplary preferred conditions, compositions and other attributes of the preferred epitaxially grown second silicon-comprising layer are the same as those described above with respect to the second silicon-comprising layer of the first described embodiment. For example and by way of example only, the first and second silicon-comprising layers might be of the same composition or of different compositions. FIG. 13 depicts essentially the same composition, with the previous outline of first silicon-comprising layer 34 perhaps not being distinguishable when formed of the same composition.

By way of example only, any of the above-described and depicted FIGS. 1–13 embodiments preferably comprise incorporating the first and second silicon-comprising layers into a component of a field effect transistor. In one exemplary implementation, the component comprises a channel region of the field effect transistor, and in another embodiment comprises a source/drain region of a field effect transistor, for example particularly in vertically-oriented field effect transistors. Further in one exemplary preferred embodiment, the first and second silicon-comprising layers are incorporated into both a channel region and a source/drain region of a vertical transistor. For example and by way of example only with respect to the FIG. 13 construction, an elevation or thickness 40 of materials 34 and 36 can be fabricated or otherwise provided to constitute at least a part of a source/drain region of a vertical transistor in fabrication. In such a depicted exemplary embodiment, source/drain region 40 comprises both epitaxially grown first silicon-comprising layer 34 and epitaxially grown second silicon-comprising 36. Further in the FIG. 13 embodiment, an elevational portion 42 of materials 34 and 36 will comprise a channel region of a vertical transistor being fabricated. Suitable conductivity enhancing dopant type and concentration in the respective regions 40 and 42 can be provided during epitaxial growth, or subsequent thereto for example using ion implantation or some other technique, and whether existing or yet-to-be developed.

Figure 14:
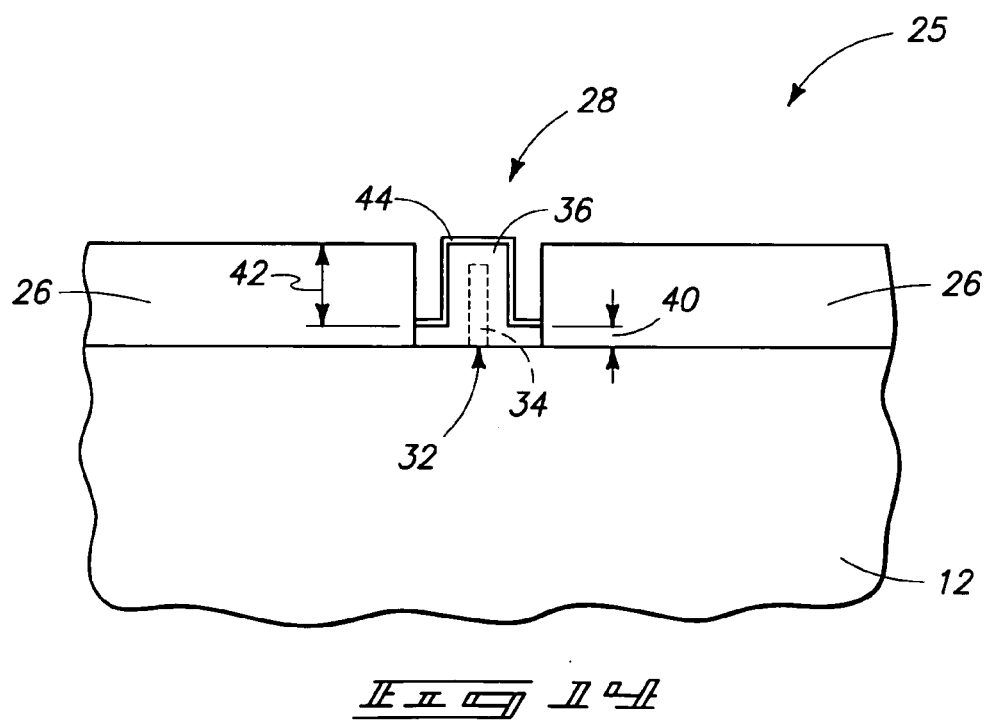
FIG. 14 is a view of the FIG. 13 substrate at a processing step subsequent to that shown by FIG. 13.

Referring to FIG. 14, a gate dielectric layer 44 has been formed over second silicon-comprising layer 36. Exemplary preferred materials include silicon dioxide and silicon nitride.

Figure 15:
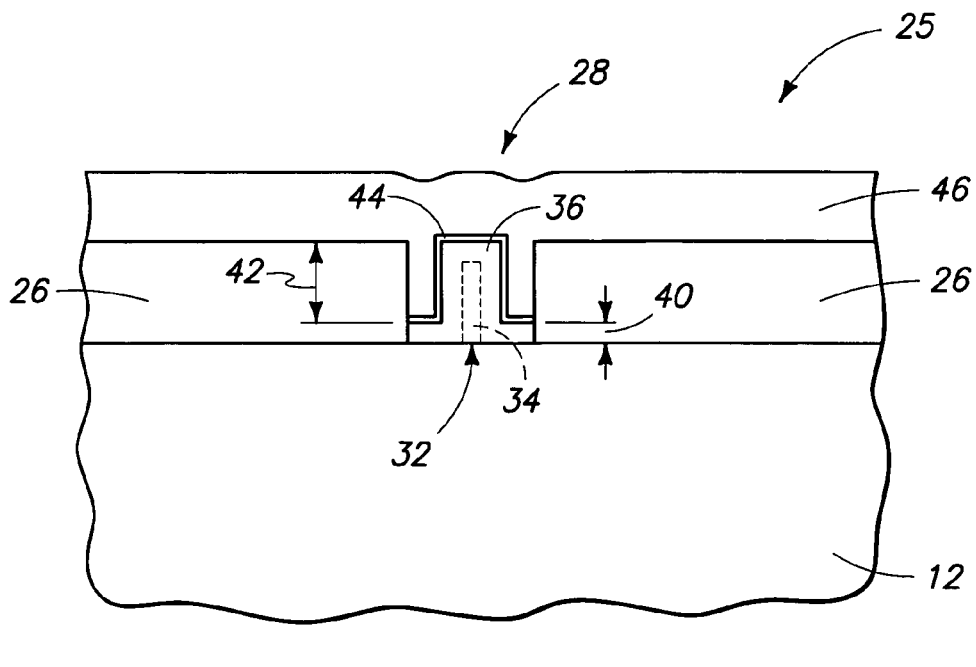
FIG. 15 is a view of the FIG. 14 substrate at a processing step subsequent to that shown by FIG. 14.

Referring to FIG. 15, a gate material 46 has been deposited. An exemplary preferred material is conductively doped polysilicon.

Figure 16:
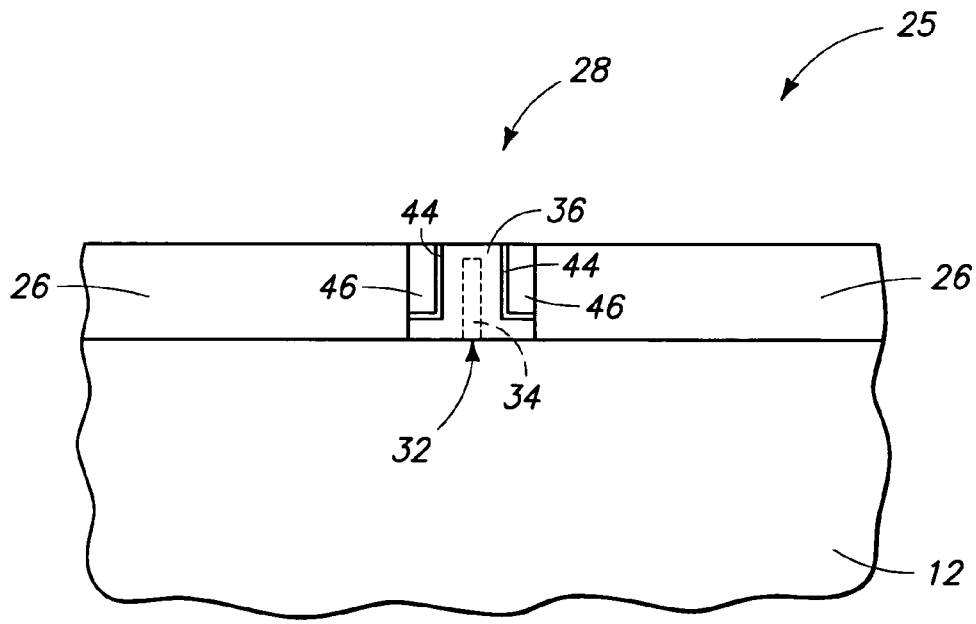
FIG. 16 is a view of the FIG. 15 substrate at a processing step subsequent to that shown by FIG. 15.

Referring to FIG. 16, gate material 46 and gate dielectric material 44 have been removed from over second epitaxially grown silicon-comprising layer 36 effective to expose second silicon-comprising layer 36. An exemplary preferred technique for doing so comprises polishing, for example chemical-mechanical polishing. In the exemplary depicted and preferred embodiment, the polishing is at least to an outer surface of first material 26.

The above processing describes but one exemplary method of forming a gate dielectric layer and a gate over a second silicon-comprising layer, and in conjunction with the fabrication of a vertical transistor. In the depicted exemplary preferred embodiment, such is conducted without any photomasking at least after forming opening 28 within first material 26.

Figure 17:
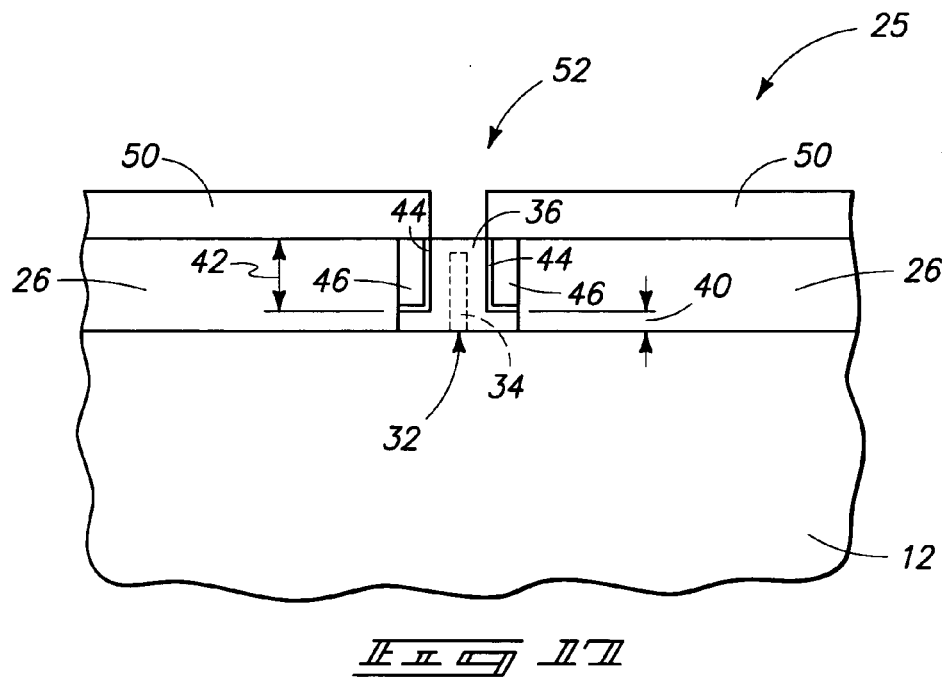
FIG. 17 is a view of the FIG. 16 substrate at a processing step subsequent to that shown by FIG. 16.
Figure 18:
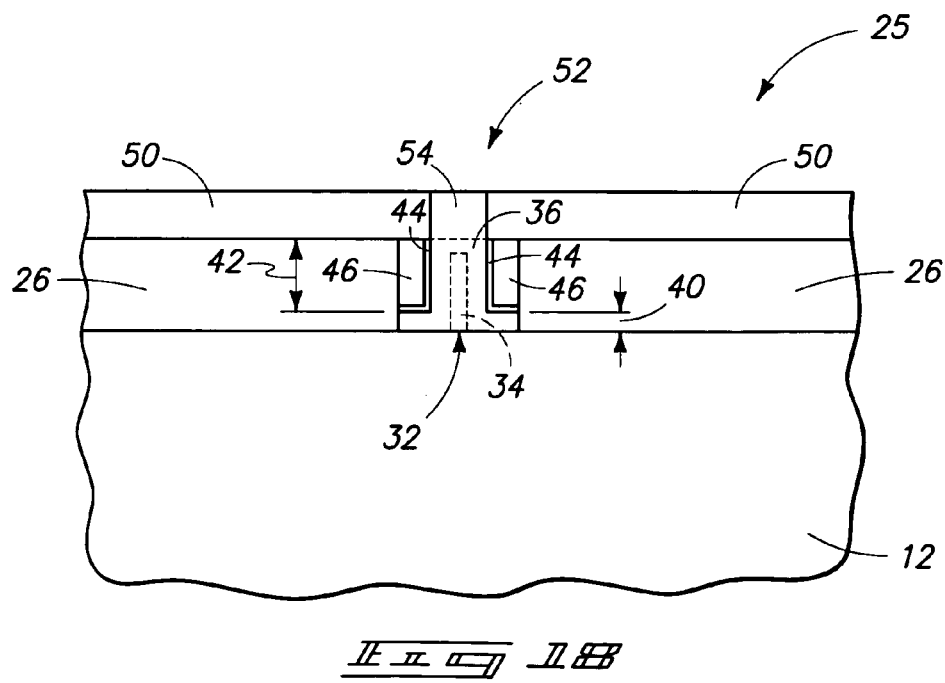
FIG. 18 is a view of the FIG. 17 substrate at a processing step subsequent to that shown by FIG. 17.

Referring to FIG. 17, an overlying layer 50 has been fabricated over the substrate and an opening 52 provided therein to second silicon-comprising layer 36 of channel region 42. An exemplary material 50 comprises undoped silicon dioxide. Another source/drain region for the exemplary vertical transistor can be fabricated within opening 52 or otherwise in operable electrical connection with channel region 42 of the field effect transistor. FIG. 18 depicts one exemplary preferred embodiment of providing the same, for example by epitaxially growing a third silicon-comprising layer 54 from the second silicon-comprising layer 36 of channel region 42, and for example within opening 52 as shown. Epitaxially grown third silicon-comprising layer 54 can be formed by the same methods described above, and of the same compositions described above, of the described first and second silicon-comprising layers. Suitable conductivity-type doping and concentration can be provided during epitaxial growth thereof, or subsequently.

Figure 19:
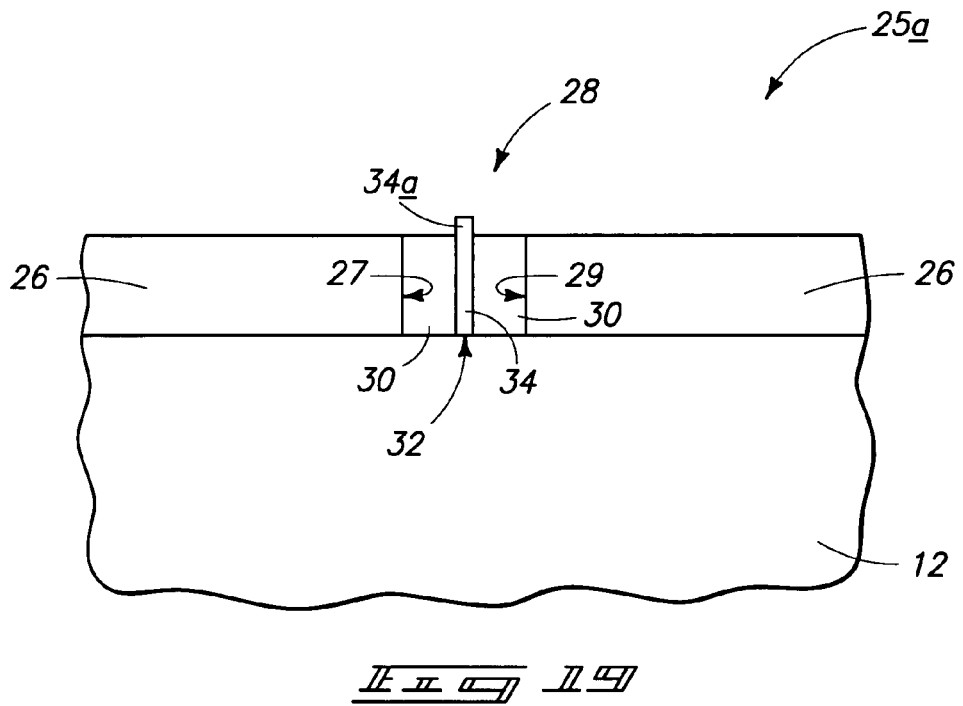
FIG. 19 is a diagrammatic sectional view of a semiconductor substrate in process in accordance with an aspect of the invention.

In the depicted FIGS. 7–18 embodiments, the epitaxially grown first silicon-comprising layer 34 is depicted as having been grown to an elevational thickness which is less than that of first material 26. FIG. 19, by way of example only, depicts an alternate exemplary embodiment fragment 25a. Like numerals from the first-described embodiment have been utilized where appropriate, with differences being indicated with the suffix "a" or with different numerals. FIG. 19 corresponds in sequence to that of FIG. 11, but wherein epitaxially grown first silicon-comprising layer 34a has been grown to an elevational thickness which is greater than that of first material 26. Alternately by way of example only, the first silicon-comprising layer might be grown to an elevational thickness which is equal to that of first material 26. Subsequent processing could occur as described above, or otherwise.

Figure 20:
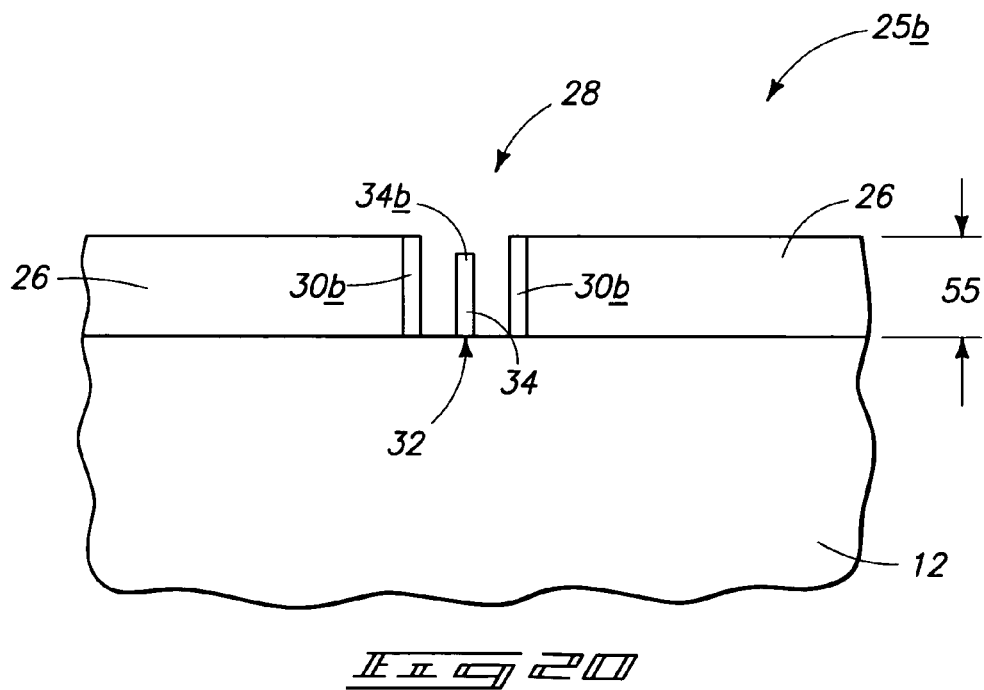
FIG. 20 is a diagrammatic sectional view of a semiconductor substrate in process in accordance with an aspect of the invention.

The FIGS. 7–18 embodiment depicted the removing of all remaining of second material lining 30 from within opening 28. The invention also, of course, contemplates removing only a portion of the second material lining, for example and by way of example only as shown in connection with the substrate fragment 25b in FIG. 20. Like numerals from the FIGS. 7–18 embodiment have been utilized where appropriate, with differences being indicated by the suffix "b" or with different numerals. The second material lining can be considered as comprising an elevational thickness 55. Accordingly, FIG. 20 indicates that the portion of the second material lining which has been removed comprises all of an elevational thickness 55 portion, thereby leaving second material lining portion 30b. Subsequent processing could occur as described above, or otherwise.

Figure 21:
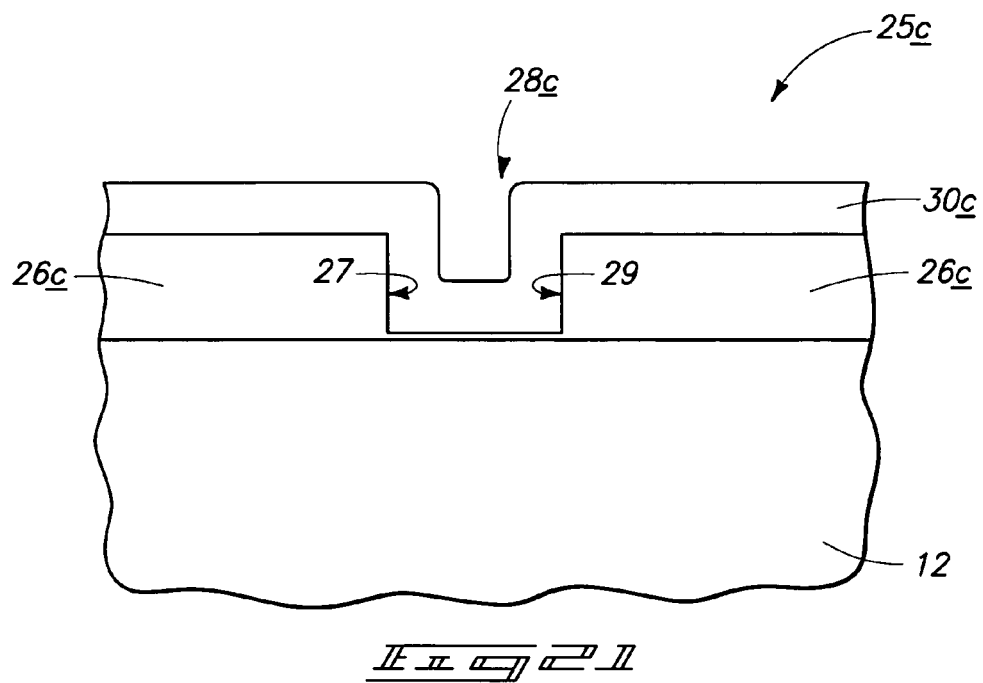
FIG. 21 is a diagrammatic sectional view of a semiconductor substrate in process in accordance with an aspect of the invention.

The above FIGS. 7–20 embodiments depict opening 28 formed within first material 26 as extending to monocrystalline material 12 prior to any lining of the opposing sidewalls. An alternate exemplary processing method is described with reference to FIGS. 21–24 in connection with a substrate fragment 25c. Like numerals from the first-described embodiments have been utilized where appropriate, with differences being indicated by the suffix "c", or with different numerals. Opening 28c and first material 26c are depicted as not extending all the way therethrough to monocrystalline material 12 in FIG. 21.

Figure 22:
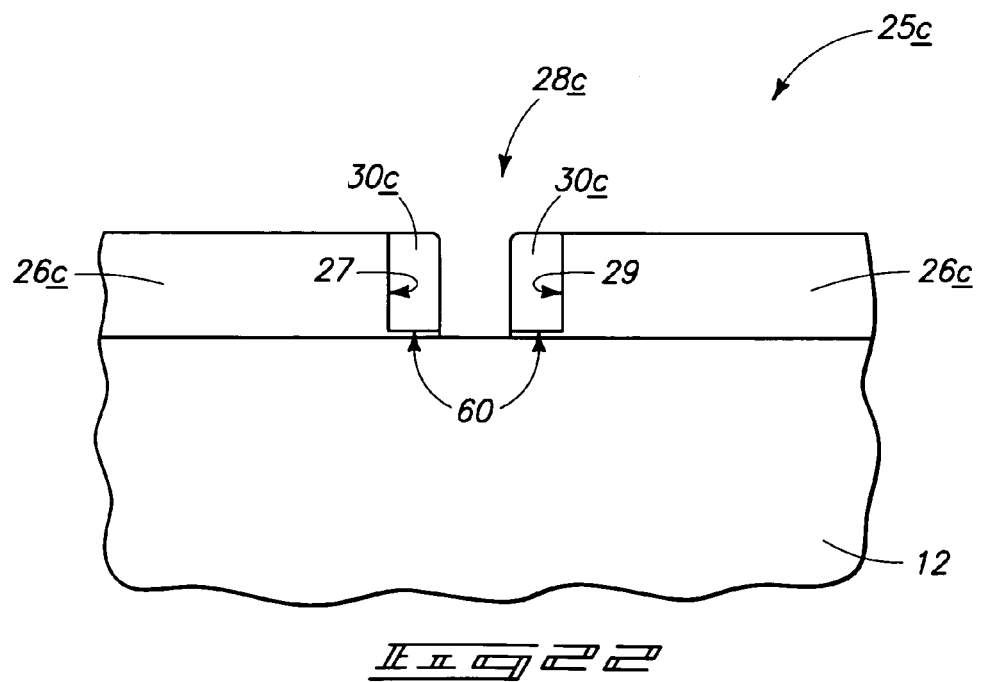
FIG. 22 is a view of the FIG. 21 substrate at a processing step subsequent to that shown by FIG. 21.

Referring to FIG. 22, exemplary anisotropic etching has been conducted to leave lining 30c of the second material within opening 28c. Such etching is depicted as including the etching of material 26c to extend opening 28c to monocrystalline material 12. Alternately, such etching to expose monocrystalline material 12 might not occur at this point in the process. Regardless, first material 26c can be considered as comprising a shelf or shelves 60 within opening 28 over which second material 30c is received.

Figure 23:
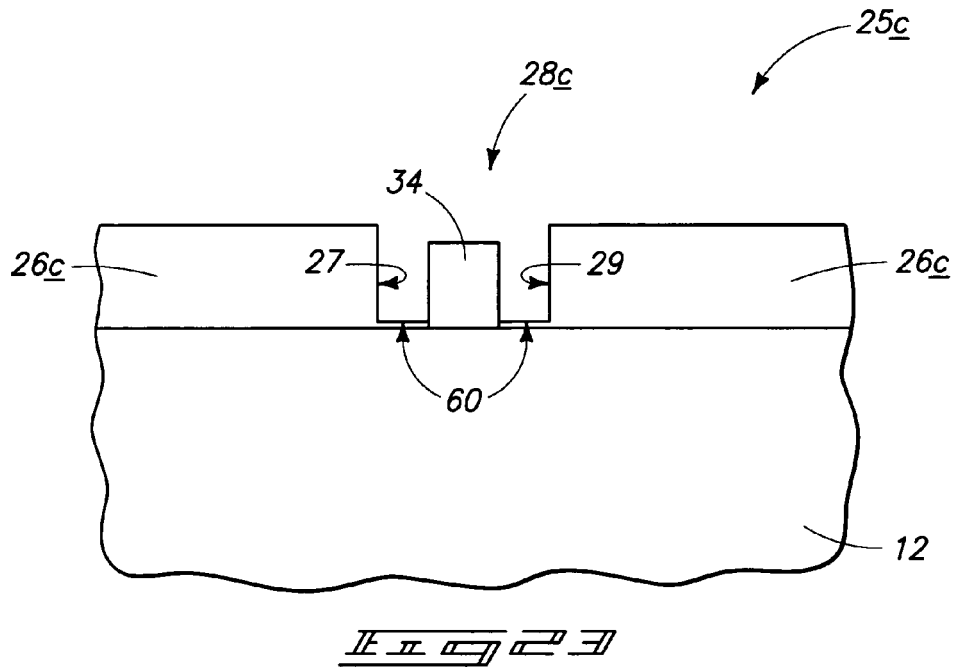
FIG. 23 is a view of the FIG. 22 substrate at a processing step subsequent to that shown by FIG. 22.

Referring to FIG. 23, at some point monocrystalline material 12 has been exposed within opening 28c and a first silicon-comprising layer 34 has been epitaxially grown from such material within the second material-lined opening 28c. Subsequently, all remaining of second material 30c (not shown in FIG. 23) has been removed from between epitaxially grown first silicon-comprising layer 34 and first material 26c to over first material shelf/shelves 60.

Figure 24:
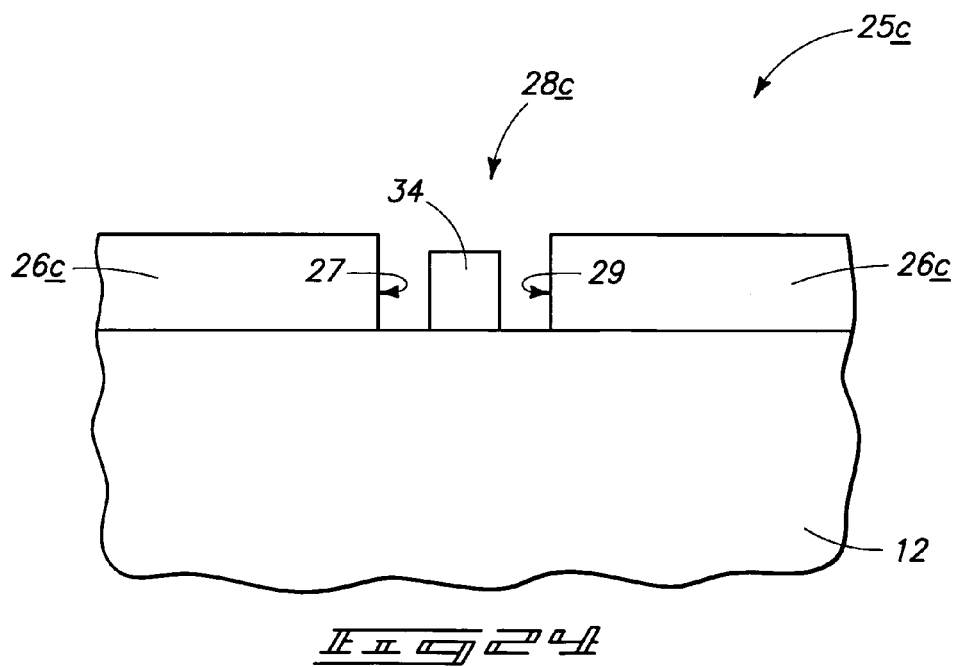
FIG. 24 is a view of the FIG. 23 substrate at a processing step subsequent to that shown by FIG. 23.

Referring to FIG. 24, shelves 60 have been removed effective to expose monocrystalline material 12 beneath such shelves. Subsequent processing can occur as described above, or otherwise.

Aspects of methods of forming epitaxial silicon-comprising layers and in methods of forming vertical transistors can be considered as providing material over a monocrystalline surface and including an opening in the material extending to the monocrystalline surface. For example, and by way of example only, FIG. 10 depicts material 26, 30 received over a monocrystalline surface 32, including an opening 33 in material 26, 30 extending to surface 32. A first silicon-comprising layer is epitaxially grown from the monocrystalline surface 32 within opening 33, for example as shown in FIG. 11. After growing first silicon-comprising layer 34, opening 33 is widened effective to expose an additional monocrystalline surface, for example as depicted in FIG. 12 in widening opening 33 to the extent of an opening 28.

A second silicon-comprising layer is epitaxially grown from the additional monocrystalline surface within the widened opening and from the first silicon-comprising layer, for example as shown with respect to the second silicon-comprising layer 36 in FIG. 13.

In the depicted FIGS. 11 and 12 embodiment, the widening of the opening is on both sides of first silicon-comprising layer 36. Further in the exemplary FIG. 12 embodiment, the widening centers first silicon-comprising layer 34 within widened opening 28. The invention also contemplates the widening of the opening, i.e., opening 33, on only one of the opposing sides of the first silicon-comprising layer, for example as depicted in connection with a semiconductor substrate 75 in FIG. 25. Like numerals from the first-described embodiment have been utilized where appropriate, with differences being indicated with the suffix "d" or with different numerals. Substrate fragment 75 comprises an opening 33d within which second material 30d has been provided, and on only one side of epitaxially grown first silicon-comprising layer 34d. First silicon-comprising layer 30d is depicted in FIG. 26 as having been removed. Subsequent epitaxial growth of a second silicon-comprising layer (not shown) can thereafter be conducted relative to epitaxially grown first silicon-comprising layer 34d and material 12 exposed within widened opening 28d.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a vertical transistor, comprising:
providing material over a monocrystalline surface and including an opening in the material extending to the monocrystalline surface;
epitaxially growing a first silicon-comprising layer from the monocrystalline surface within the opening;
after growing the first silicon-comprising layer, widening the opening effective to expose an additional monocrystalline surface;
epitaxially growing a second silicon-comprising layer from the additional monocrystalline surface within the widened opening and from the first silicon-comprising layer;
forming a gate dielectric layer of the vertical transistor over the second silicon-comprising layer, and a gate of the vertical transistor over the gate dielectric layer; and
providing the second silicon-comprising layer to comprise at least a part of both a channel region of the vertical transistor and a source/drain region of the vertical transistor.

2. The method of claim 1 wherein the widening is on both of opposing sides of the first silicon-comprising layer.

3. The method of claim 2 wherein the widening centers the first silicon-comprising layer within the widened opening.

4. The method of claim 1 wherein the widening is on only one of opposing sides of the first silicon-comprising layer.

5. The method of claim 1 comprising removing some of the gate dielectric layer from over the second silicon-comprising layer.

6. The method of claim 5 wherein the removing comprises chemical mechanical polishing.

7. The method of claim 1 wherein the forming of the gate dielectric layer and the gate comprises polishing of both gate material and gate dielectric layer material.

8. The method of claim 7 wherein the polishing is at least to an outer surface of the material.

9. The method of claim 1 wherein the forming of the gate dielectric layer and the gate is conducted without photomasking at least after forming the opening.

10. The method of claim 1 comprising forming another source/drain region of the vertical transistor by epitaxially growing a third silicon-comprising layer from the second silicon-comprising layer of the channel region.

11. The method of claim 10 wherein the epitaxial growing of the third silicon-comprising layer occurs within an opening formed in an overlying layer.

12. The method of claim 1 comprising providing the first silicon-comprising layer to comprise a part of the source/drain region.

13. The method of claim 1 comprising providing the first silicon-comprising layer to comprise a part of the channel region.

14. The method of claim 1 comprising providing the first silicon-comprising layer to comprise at least a part of both of the source/drain region and the channel region.

15. A method of forming a vertical transistor, comprising:
epitaxially growing a first silicon-comprising material from a monocrystalline surface within an opening in a material over the monocrystalline surface, the opening in the material extending to the monocrystalline surface;
after growing the first silicon-comprising material, widening the opening effective to expose an additional monocrystalline surface;

epitaxially growing a second silicon-comprising material from the additional monocrystalline surface within the widened opening;

forming a gate dielectric of the vertical transistor over the second silicon-comprising material; and forming a gate of the vertical transistor over the gate dielectric, wherein the second silicon-comprising material comprises at least a part of a channel region of the vertical transistor, and/or a source region of the vertical transistor, and/or a drain region of the vertical transistor.

16. The method of claim 15 wherein the widening centers the first silicon-comprising material within the widened opening.

17. The method of claim 15 wherein the forming of the gate dielectric and the gate comprises polishing of both gate material and gate dielectric layer material.

18. The method of claim 17 wherein the forming of the gate dielectric and the gate is conducted without photomasking at least after forming the opening.

19. The method of claim 15 wherein the second silicon-comprising material comprises at least a part of the source region or the drain region.

20. The method of claim 15 wherein the second silicon-comprising material comprises at least a part of the channel region.

21. The method of claim 20 comprising forming a source/drain region of the vertical transistor by epitaxially growing a third silicon-comprising material from the second silicon-comprising material of the channel region.

22. The method of claim 20 wherein the epitaxial growing of the third silicon-comprising material occurs within an opening formed in an overlying layer.

23. A method of forming a vertical transistor, comprising:

epitaxially growing a first silicon-comprising material from a monocrystalline surface within an opening in a material over the monocrystalline surface, the opening in the material extending to the monocrystalline surface;

after growing the first silicon-comprising material, widening the opening effective to expose an additional monocrystalline surface; and epitaxially growing a second silicon-comprising material from the additional monocrystalline surface, wherein the second silicon-comprising material comprises at least a part of a channel region of the vertical transistor, and/or a source region of the vertical transistor, and/or a drain region of the vertical transistor.

24. The method of claim 23 wherein the second silicon-comprising material comprises at least a part of the source region or the drain region.

25. The method of claim 23 wherein the second silicon-comprising material comprises at least a part of the channel region.

26. The method of claim 25 comprising forming a source/drain region of the vertical transistor by epitaxially growing a third silicon-comprising material from the second silicon-comprising material of the channel region.

27. The method of claim 26 wherein the epitaxial growing of the third silicon-comprising material occurs within an opening formed in an overlying layer.

* * * * *

UNITED STATES PATENT AND TRADEMARK OFFICE
CERTIFICATE OF CORRECTION

PATENT NO. : 7,276,416 B2
APPLICATION NO. : 11/256424
DATED : October 2, 2007
INVENTOR(S) : Ramaswamy et al.

It is certified that error appears in the above-identified patent and that said Letters Patent is hereby corrected as shown below:

In column 11, line 31, in Claim 22, delete "claim 20" and insert -- claim 21 --, therefor.

Signed and Sealed this

Eleventh Day of December, 2007

JON W. DUDAS
*Director of the United States Patent and Trademark Office*